United States Patent [19]

Chan et al.

[11] Patent Number: 5,594,364

[45] Date of Patent: Jan. 14, 1997

[54] PROGRAMMABLE APPLICATION SPECIFIC INTEGRATED CIRCUIT AND LOGIC CELL THEREFOR

[75] Inventors: Andrew K. Chan, Palo Alto; John M. Birkner, Portola Valley; Hua-Thye Chua, Los Alto Hills, all of Calif.

[73] Assignee: QuickLogic Corporation, Santa Clara, Calif.

[21] Appl. No.: 493,981

[22] Filed: Jun. 23, 1995

Related U.S. Application Data

[63] Continuation of Ser. No. 245,309, May 17, 1994, Pat. No. 5,430,390, which is a continuation of Ser. No. 847,382, Mar. 6, 1992, abandoned, which is a continuation of Ser. No. 665,103, Mar. 6, 1991, Pat. No. 5,122,685.

[51] Int. Cl.$^6$ .................................................... H03K 19/177
[52] U.S. Cl. .............................. 326/39; 326/41; 326/47
[58] Field of Search ......................................... 326/38–44

[56] References Cited

U.S. PATENT DOCUMENTS

| | | | |
|---|---|---|---|
| 3,619,583 | 11/1971 | Arnold | 235/152 |
| 4,124,899 | 11/1978 | Birkner et al. | 34/716 |
| 4,354,266 | 10/1982 | Cooperman et al. | 370/112 |
| 4,453,096 | 6/1984 | Le Can et al. | 307/448 |
| 4,491,839 | 1/1985 | Adam | 307/451 |

(List continued on next page.)

OTHER PUBLICATIONS

Weste et al.; "Principles of CMOS VLSI Design: A Systems Approach"; copyright 1985 by AT&T Bell Laboratories, Inc. and Kamran Eshraghian; pp. 55–57. (No month available).

*Databook and Design Manual, HCMOS Macrocells, Macrofunctions*, LSI Logic pp. 9–5 through 9–9, 12–87 through 12–88, and 12–94 (1986). No month available.

Wong, et al., "Novel Circuit Techniques for Zero-Power 25-ns CMOS Erasable Programmable Logic Devices (EPLD's)", IEEE Journal of Solid-State Circuits vol. SC–21, No. 5, Oct. 1986, pp. 766–774.

Pathak, et al., "A 19-ns 250-mW CMOS Erasable Programmable Logic Device", IEEE Journal of solid-State Circuits, vol. SC–21, No. 5, Oct. 1986, pp. 775–784.

*Pal Device Data Book*, Advanced Micro Devices, Inc., pp. i and 5–97 through 5–102 (1988).

*CMOS Logic Data Book*, National Semiconductor, pp. iii, 3–75, 3–82 and 3–86 (1988) (No month available).

*The Programmable gate Array Data Book*, Xilinx, pp. 2–1 through 2–28 (1989) (no month available).

*IEEE Standard Dictionary of Electrical and Electronics Terms*, Second Edition, IEEE, 1977, p. 282 (No month available).

*Encyclopedia of Computer Science and Engineering*, Second Edition, Van Nostrand Reinhold Company, 1983, pp. 879–881 and 1633. (No month available).

*The New IEEE Standard Dictionary of Electrical and Electronics Terms*, IEEE, Fifth Edition, Jan. 1993, p. 549.

(List continued on next page.)

*Primary Examiner*—Edward P. Westin
*Assistant Examiner*—Benjamin D. Driscoll
*Attorney, Agent, or Firm*—Skjerven, Morrill, MacPherson, Franklin and Friel

[57] ABSTRACT

A field programmable gate array includes a programmable routing network, a programmable configuration network integrated with the programmable routing network; and a logic cell integrated with the programmable configuration network. The logic cell includes four two-input AND gates, two six input AND gates, three multiplexers, and a delay flipflop. The logic cell is a powerful general purpose universal logic building block suitable for implementing most TTL and gate array macrolibrary functions. A considerable variety of functions are realizable with one cell delay, including combinational logic functions as wide as thirteen inputs, all boolean transfer functions for up to three inputs, and sequential flipflop functions such as T, JK and count with carry-in.

2 Claims, 9 Drawing Sheets

U.S. PATENT DOCUMENTS

| | | | |
|---|---|---|---|
| 4,541,067 | 9/1985 | Whitaker | 364/716 |
| 4,551,634 | 11/1985 | Takahashi et al. | 307/243 |
| 4,558,236 | 12/1985 | Burrows | 307/465 |
| 4,566,064 | 1/1986 | Whitaker | 364/300 |
| 4,577,124 | 3/1986 | Koike | 307/451 |
| 4,609,986 | 9/1986 | Hartmann et al. | 364/200 |
| 4,616,358 | 10/1986 | Rehm et al. | 370/58 |
| 4,617,479 | 10/1986 | Hartmann et al. | 307/465 |
| 4,620,117 | 10/1986 | Fang | 307/451 |
| 4,622,648 | 11/1986 | Whitaker | 364/715 |
| 4,642,487 | 2/1987 | Carter | 307/465 |
| 4,684,829 | 8/1987 | Uratani | 307/449 |
| 4,684,830 | 8/1987 | Tsui et al. | 307/465 |
| 4,695,740 | 9/1987 | Carter | 307/242 |
| 4,706,216 | 11/1987 | Carter | 365/103 |
| 4,710,649 | 12/1987 | Lewis | 307/451 |
| 4,733,405 | 3/1988 | Shimizume et al. | 377/29 |
| 4,754,456 | 6/1988 | Yato et al. | 370/112 |
| 4,758,746 | 7/1988 | Birkner et al. | 307/465 |
| 4,758,985 | 7/1988 | Carter | 365/103 |
| 4,764,893 | 8/1988 | Karabatsos | 364/900 |
| 4,771,285 | 9/1988 | Agrawal et al. | 340/825.83 |
| 4,774,421 | 9/1988 | Hartmann et al. | 307/465 |
| 4,786,904 | 11/1988 | Graham, III et al. | 307/243 |
| 4,787,064 | 11/1988 | Wagner | 364/900 |
| 4,789,951 | 12/1988 | Birkner et al. | 307/465 |
| 4,825,105 | 4/1989 | Hölzle | 307/465 |
| 4,852,021 | 7/1989 | Inoue et al. | 364/200 |
| 4,870,302 | 9/1989 | Freeman | 307/465 |
| 4,871,930 | 10/1989 | Wong et al. | 307/465 |
| 4,873,459 | 10/1989 | El Gamal et al. | 307/465 |
| 4,876,640 | 10/1989 | Shankar et al. | 364/200 |
| 4,878,200 | 10/1989 | Asghar et al. | 365/189.02 |
| 4,879,481 | 11/1989 | Pathak et al. | 307/465 |
| 4,910,417 | 3/1990 | El Gamal et al. | 307/465 |
| 4,910,466 | 3/1990 | Kiuchi et al. | 307/243 |
| 4,912,339 | 3/1990 | Bechade et al. | 307/243 |
| 4,914,322 | 4/1990 | Win et al. | 307/465 |
| 4,933,577 | 6/1990 | Wong et al. | 307/465 |
| 4,940,908 | 7/1990 | Tran | 307/433 |
| 4,963,770 | 10/1990 | Keida | 326/40 |
| 5,015,883 | 5/1991 | Waller | 307/465 |
| 5,019,736 | 5/1991 | Furtek | 307/465 |
| 5,045,714 | 9/1991 | Park et al. | 307/243 |
| 5,055,718 | 10/1991 | Galbraith | 307/465 |
| 5,068,603 | 11/1991 | Mahoney | 324/158 |
| 5,107,146 | 4/1992 | El-Ayat | 307/465 |
| 5,122,685 | 6/1992 | Chan et al. | 307/465 |
| 5,168,177 | 12/1992 | Shankar et al. | 307/465 |
| 5,185,706 | 2/1993 | Agrawal et al. | 364/489 |
| 5,220,213 | 6/1993 | Chan et al. | 326/40 |
| 5,280,202 | 1/1994 | Chan | 307/465 |
| 5,338,983 | 9/1994 | Agarwala | 307/465 |
| 5,349,250 | 9/1994 | New | 307/465 |
| 5,396,127 | 3/1995 | Chan et al. | 326/44 |
| 5,416,367 | 5/1995 | Chan et al. | 326/44 |
| 5,430,390 | 7/1995 | Chan et al. | 326/38 |
| B1 4,617,479 | 9/1993 | Hartmann et al. | 307/465 |

OTHER PUBLICATIONS

Charles J. Sippl et al., *Computer Dictionary & Handbook*, Third Edition, 1982, pp. 220 and 265 (No month available).

R. P. Turner et al., *The Illustrated Dictionary Electronics*, Tab Books, Inc., Third Edition, 1985, pp. 22–23, 345 and 357–358 (No month available).

S. Murugesan, "Programmable Universal Logic Module", International Journal of Electronics, vol. 40, No. 5, May 1976, pp. 509–512.

The TTL Data Book for Design Engineers, Texas Instruments, Inc., 2nd Edition, 1976, pp. 7–181 to 7–182 (No month available).

Stephen S. Yau et al., "Universal Logic Modules and Their Applications", IEEE Trans. on Computers, vol. C–19, No. 2, Feb. 1970, pp. 141–149.

K. El–Ayat et al., "A CMOS Electrically Configurable Gate Array," IEEE Journal of Solid–State Circuits, vol. 24, No. 3, Jun. 1989, pp. 752–761.

C. H. Roth, Jr., "Fundamentals of Logic Design", Second Edition, West Publishing, 1979, pp. 22–23, 155–171 and 625–626 (No month available).

X. Chen et al., "A Comparison of Universal–Logic–Module Realizations and Their Application in the Synthesis of Combinatorial and Sequential Logic Networks", IEEE Trans. on Computers, vol. C–31, No. 2, Feb. 1968, pp. 140–147.

V. Thomas Rhyne, "Fundamentals of Digital Systems Design", Prentice–Hall 1973, pp. 69–71 and 86–87 (No month available).

Rose et al., "The Effect of Logic Block Complexity on Area of Programmable Gate Arrays," IEEE 1989 Custom Integrated Circuits Conference, 5.3.1–5.3.5 (1989).

ACT™ Family Field Programmable Gate Array Databook, 1–47–1–49 (Apr. 1990) (No month available).

Monolithic Memories, PAL®/PLE™ Device Programmable Logic Array Handbook (Fifth Edition), 1–2–1–16 (1986).

El Gamal et al., "An Architecture for Electrically Configurable Gate Arrays", IEEE Journal of Solid–State Circuits, vol. 24, No. 2, pp. 394–398, Apr. 1989 (reprinted Apr. 1990 in Actel Databook).

Haines, "Field–Programmable Gate Array with Non–Volatile Configuration", Microprocessors and Microsystems, vol. 13, No. 5, pp. 305–312, Jun. 1989 (reprinted in Apr. 1990 Actel Databook).

M. Morris Mano, Computer Engineering: Hardware Design 1988, p. 104. No month available.

PROGRAMMABLE APPLICATION SPECIFIC INTEGRATED CIRCUIT AND LOGIC CELL THEREFOR

This application is a continuation of application Ser. No. 08/245,309, filed May 17, 1994, now U.S. Pat. No. 5,430,390, which is a file wrapper continuation of U.S. Ser. No. 07/847,382, filed Mar. 6, 1992, abandoned, which is a continuation of U.S. Ser. No. 07/665,103, filed Mar. 6, 1991, now U.S. Pat. No. 5,122,685.

BACKGROUND OF THE INVENTION

1. Field of the Invention

The present invention relates to application specific integrated circuits, and more specifically to field programmable gate arrays and logic cells therefor.

2. Description of Related Art

Application specific integrated circuits ("ASIC") provide their users the ability to manufacture products having a proprietary design without having to begin the design at the device level. Many different ASIC technologies are available, including gate array, standard cell, full custom design, and programmable logic devices. The gate array, standard cell, and full custom technologies offer high performance and flexibility, although at the expense of a long development cycle and a high non-recurring engineering cost. Programmable logic devices, which include programmable logic array devices ("PLD") and field programmable logic array devices ("FPLA"), are useful in a variety of applications such as glue logic and simple integrated circuit designs. Their utility has been limited in general due to a relatively low number of available usable gates, poor flexibility in implementing the required logic functions, low speed of operation, and high power consumption.

The reason for the limited utility of FPLA and PLD devices is generally due to the exponential increase in the size of the array as the number of logic elements increase. A FPLA typically contains a programmable AND array and a programmable OR array, while a PLD typically contains a programmable AND array and a fixed OR array. The programmable elements in a programmable array are constructed of active devices such as diodes or transistors connected to a fusible link, ultraviolet erasable floating gate devices, and electrically erasable floating gate devices. Generally, such devices are resistive and high in parasitic capacitance, and consume a relatively large silicon area. Since generally each product term consumes a certain amount of power, as the array size increases, the power dissipation increases. Moreover, the speed decreases with increasing array size, due to the increasingly parasitic capacitance of the array. Hence, for a given technology, the size of the array is restricted by practical considerations.

The utility of PLDs and FPLAs has been further extended by the technique of a programmable interconnect network for modules consisting of small PLDs or FPLAs. While some improvement in maximum practical size is realized, the degree of improvement is limited by the same problems afflicting PLDs and FPLAs; specifically, speed deterioration and power dissipation.

One device of the programmable interconnect small array type is disclosed in U.S. Pat. No. 4,774,421, issued Sep. 22, 1988 to Hartmann et al. The device consists of a plurality of "macrocells," each including a programmable AND array, an OR/NOR array, a feedback row driver, and an I/O driver and input circuit. The macrocells are driven from two common buses, one carrying input signals and the other carrying feedback signals. This device achieves a logic complexity of 300 2-input NAND gates.

Another device of the programmable interconnect small array type is disclosed in U.S. Pat. No. 4,847,612, issued Jul. 11, 1989. A plurality of functional units are arranged in a matrix of rows and columns. Each functional unit has 12 inputs and 9 outputs, although the number may vary. Each functional unit performs one or more logical functions. Vertical lines are permanently connected to the outputs of the functional units, while horizontal lines are permanently connected to the inputs of the functional units. Each of the horizontal and vertical lines is a collection of conductive lines whose number matches the number of inputs and outputs of one of the functional units. The horizontal and vertical lines cross at various areas of the device to form programmable interconnection matrices. Programming may be by mask, conductive fuses, or EPROM/EEPROM switching transistors.

Each functional unit is a relatively small programmable logic array which is mask programmable, fuse programmable, or switch programmable. Other types of functional units such as random access memories and arithmetic logic units may be present. Moreover, additional specialized logic at the output of the sum terms may be present.

Electrically configurable gate arrays have been developed to overcome the gate density limitations of programmable array logic devices and field programmable logic arrays. One such device is disclosed in U.S. Pat. No. 4,758,745, issued Jul. 19, 1988 to EL Gamal et al. In the EL Gamal et al. patent, a universal logic module having 3 input terminals and 2 output terminals and functioning as a 2:1 multiplexer is shown. Different types of array modules as well as combinations of two or more types may be used, as well as RAM arrays, ROM arrays, multipliers, and ALUs optimized to implement certain functions. The five terminals of the logic cell are hardwired to five separate vertical wiring channels. Wire channels are segmented and offset.

A similar device to that disclosed in the aforementioned EL Gamal et al. patent is disclosed in an article by K. A. El-Ayat et al., "A CMOS Electrically Configurable Gate Array," IEEE Journal of Solid State Circuits, Vol. 24, No. 3, June 1989, pp. 752–61. The chip has a channeled gate array architecture consisting of configurable logic modules organized in rows and columns and separated by wiring channels. The wiring channels contain predefined segmented metal tracks of different segment length to accommodate the routing requirements. Antifuse elements are located at the intersection of the horizontal and vertical wire segments, and also between wire segments in association with isolation transistors. Circuit connections and module configuration are established by programming the appropriate antifuse elements, which then form low impedance connections as required between metal segments. The logic module is configurable, as are the I/O buffers.

El-Ayat et al. discloses a configurable logic module having eight inputs and one output, which is claimed to efficiently implement both combinatorial and sequential circuits and to optimally utilize routing resources. The module implements a 4:1 multiplexer function with inputs A–D; select inputs SA, SB, S0 and S1; and output Y. To implement the required logic function, the module is configured as the desired macrocell by programming the appropriate antifuses at its input terminals to connect the inputs to the required nets and to VDD and VSS.

Despite many improvements having been made in increasing usable gate density while reducing power dissipation, a need exists for a field programmable gate array device having even higher speed, higher density, lower power dissipation, and a more flexible architecture.

SUMMARY OF THE INVENTION

These and other disadvantages of the prior art are overcome in the present invention, which in one embodiment generally comprises a programmable routing network, a programmable configuration network integrated with the programmable routing network; and a logic cell integrated with the programmable configuration network.

In another embodiment of the present invention, an application specific integrated circuit comprises a plurality of generally parallel first conductors and a plurality of generally parallel second conductors, the first and second conductors crossing in a first crossover region and being generally insulated from one another therein. First programmable links are present in the first crossover region, disposed between preselected crossings of the first and second conductors. A logic cell having inputs and outputs comprising a plurality of generally parallel third conductors is also present, the second and third conductors crossing in a second crossover region and being generally insulated from one another therein. A plurality of second programmable links are present in the second crossover region, disposed between preselected crossings of the second conductors and said third conductors.

In another embodiment of the present cell, a logic cell for a programmable application specific integrated circuit comprises first, second and third logic gates and a first multiplexer, one data input thereof being from an output of the first logic gate, and another data input thereof being from an output of the second logic gate. The select input of the first multiplexer is from an output of the third logic gate. The embodiment further comprises fourth and fifth logic gates and a second multiplexer, one data input thereof being from an output of the fourth logic gate, and the other data input thereof being from an output of the fifth logic gate. The select input of the second multiplexer is from an output of the third logic gate. A third multiplexer having one data input from an output of the first multiplexer and another data input from an output of the second multiplexer receives a select input from a sixth logic gate, and furnishes its output to a flipflop. The output of the flipflop is the output of the logic cell.

The present invention is advantageous in many respects. For example, a one micron dual metal field programmable gate array in accordance with the present invention generally exhibits high flipflop toggle rates over 125 MHz, four bit and eight bit counter speeds over 100 MHz, and input to output delays of under 15 ns. Field programmable gate arrays having from 48 to 384 logic cells in accordance with the present invention are substantially equivalent to 500 to 4000 "gate array" gates of the prior art. Field programmable gate arrays in accordance with the present invention exhibit a low stand-by current of generally about 2 mA, and low operating power dissipation. For example, a 16 bit counter running at 100 MHz consumes under 45 mA. A logic cell structure in accordance with the present invention supports various applications, including high speed arithmetic units, counters, data paths, state machines, and glue logic applications.

BRIEF DESCRIPTION OF THE DRAWINGS

In the Figures, where like reference numerals indicate like parts.

DESCRIPTION OF THE PREFERRED AND OTHER EMBODIMENTS

Figure 1:
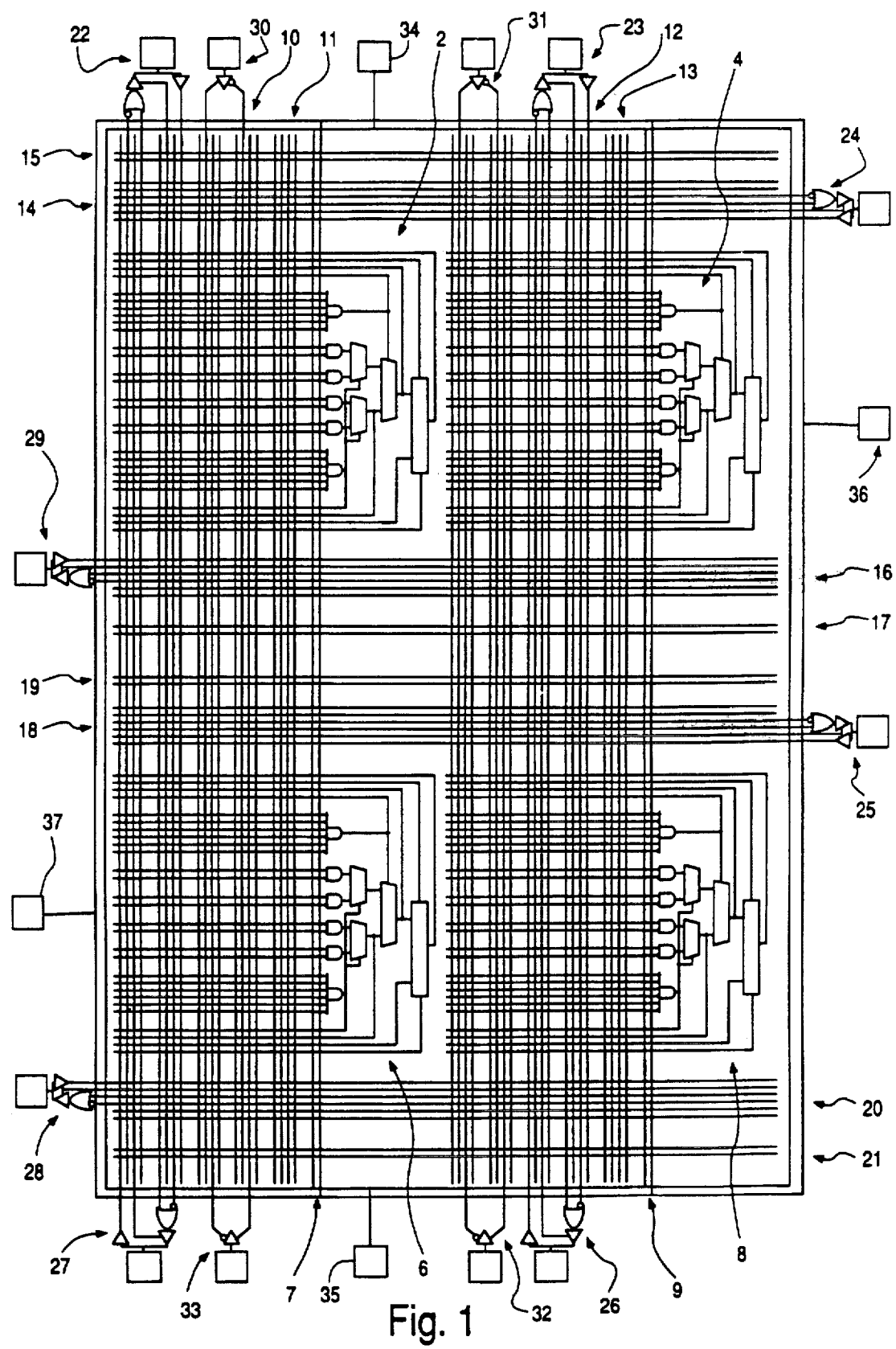
FIG. 1 is a schematic block diagram showing a 2×2 field programmable gate array of logic cells, in accordance with the present invention.

The routing and logic elements of an illustrative field programmable gate array having four logic cells is illustrated in FIG. 1. The field programmable gate array of FIG. 1 is configured as a 2×2 array of logic cells. A larger array may be achieved merely by extending the architectural features of the 2×2 array of FIG. 1 either horizontally or vertically, as desired. The array size of a practical field programmable gate array generally ranges from about 32 logic cells to about 1000 logic cells, depending on the application and the process technology used in fabrication.

A number of basic architectural features are illustrated, including logic cells 2, 4, 6, and 8; vertical wire segments 10, vertical express lines 11, and power lines 7 associated with a column of logic cells 2 and 6; vertical wire segments 12, vertical express lines 13, and power lines 9 associated with a column of logic cells 4 and 8; horizontal wire segments 14 and 16 and horizontal express lines 15 and 17 associated with a row of logic cells 2 and 4; horizontal wire segments 18 and 20 and horizontal express lines 19 and 21 associated with a row of logic cells 6 and 8; input/output ("IO") cells 22–29; input driver ("I") cells 30–33, power ("VCC") pins 34 and 35; and ground ("GND") pins 36 and 37.

Generally, pass links are provided between contiguous segments of horizontal and vertical wires, and cross links are provided where horizontal and vertical segments cross. As the architecture of FIG. 1 is a replicating architecture, one may conveniently view sections of cross links and pass links as associated with a particular logic cell. For example, each of the four quadrants of FIG. 1 may conveniently be represented by the arrangement of FIG. 2, which shows the illustrative logic cell 100 associated with a routing network and a cell configuration network. The cell configuration network generally comprises illustrative track and logic cell link section 80. The routing network generally comprises illustrative substantially identical switch sections 82 and 84, illustrative substantially identical vertical pass link sections 90 and 92, and illustrative substantially identical horizontal pass link sections 94 and 96.

In the track and logic cell link section 80, generally each crossing of a vertical wire such as 41 and a horizontal wire such as 125 from an input or output of the logic cell 100 is linked by cross links such as cross link 81. Note the cross links (not referenced) at the crossing of vertical wire groups 40, 45, 46, 47 and 50 (wires 51 and 52 only) with horizontal input wire groups 103, 105, 107, 109, 111, and 113; with horizontal input wires 122, 123 and 124; and with horizontal output wires 115, 117, 119, 121, and 125.

In the illustrative switch sections 82 and 84, generally each crossing of a vertical wire such as 41 and a horizontal wire such as 66 is linked by a cross link such as 83. Note the cross links (not referenced) at the crossing of vertical wire groups 40, 45, 46, 47 and 50 (wires 51 and 52 only) with horizontal wire groups 60, 67, 70 and 77.

Contrary to the general arrangement of cross links, the vertical wires 53 and 54 of wire group 50 and the vertical wires 56 and 57 of the wire group 55 are not provided with cross links to all of the horizontal wires. Vertical wire 56 is a power bus and vertical wire 57 is a ground bus. As ground and power are not applied to the output nodes of the logic cell, no cross links are provided in the track and logic cell link section 80 between the vertical wires 56 and 57 and the output wires 115, 117, 119, 121 and 125. Similarly, no cross links are provided in the switch sections 82 and 84 between the vertical wires 56 and 57 and the horizontal wire groups 60 and 70 and the horizontal express lines 67 and 77. Vertical wires 53 and 54 of wire group 50 are particularly suitable for certain widely distributed signals such as set, reset, and clock. Accordingly, cross links are provided between vertical wires 53 and 54 and the following horizontal wires: clock wire 122, set wire 123, reset wire 124, and express wires 68, 69, 78 and 79. In order to avoid unnecessarily loading these lines with the small but finite leakage and capacitance of additional cross links, no cross links are provided at the other wire crossings in track and logic cell link section 80 or in the switch sections 82 and 84.

As a general rule, all cross links such as 81 of track and logic cell link section 80, and 83 of switch section 82 are programmable. In the unprogrammed state, the cross links provide an open circuit. A particularly suitable type of cross link is the plasma-enhanced chemical vapor deposited ("PECVD") amorphous silicon antifuse disclosed in copending U.S. patent application Ser. No. 447,969 entitled "Method for Fabrication of Programmable Interconnect Structure," filed Dec. 8, 1989 by Whitten et al., which hereby is incorporated herein by reference. Other types of cross links may be suitable as well, however.

Figure 2:
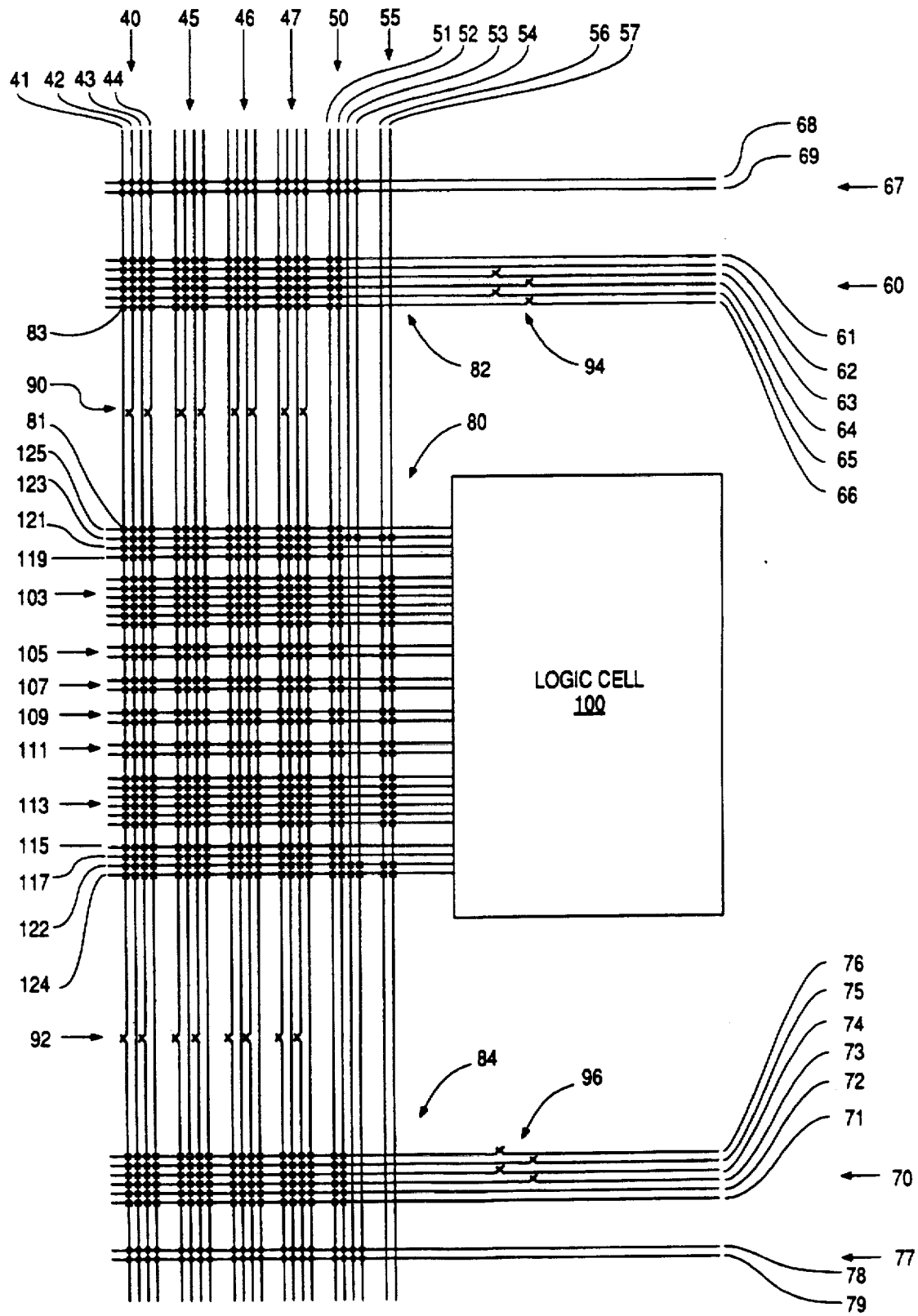
FIG. 2 is a schematic diagram of a routing network and a configuration network associated with a logic cell and useful in the field programmable gate array of FIG. 1.

Many of the horizontal and vertical wires of the field programmable gate array of FIG. 1 are wires for global connections. Most of these are segmented, with pass links being provided at opposing ends of contiguous segments. As shown in FIG. 2, for example, the vertical wires of wire groups 40, 45, 46 and 47 are segmented with pass links being indicated generally at 90 and 92; horizontal wires 63, 64, 65 and 66 of wire group 60 are segmented with respective pass links indicated generally at 94; and horizontal wires 73, 74, 75 and 76 of wire group 70 are segmented with respective pass links indicated generally at 96. Some wires are not segmented. These are generally known as "express" wires and are particularly useful for routing such signals as clock, set, and reset, as well as other signals that must be widely distributed about the chip without unnecessarily loading the drivers with the small but finite leakage and capacitance of the pass links. Unsegmented wires include the vertical wires of wire groups 50 and 55; horizontal wires 61 and 62 of the wire group 60; horizontal wires 68 and 69 of wire group 67; horizontal wires 71 and 72 of wire group 70; and horizontal wires 78 and 79 of wire group 77. Other wires are used for local purposes and are not segmented. Such wires include the horizontal wires of wire groups 103, 105, 107, 109, 111, and 113; and the horizontal wires 115, 117, 119, 121, 122, 123, 124 and 125.

A particularly suitable type of pass link is the PECVD amorphous silicon antifuse disclosed in the aforementioned copending U.S. patent application of Whitten et al., which is incorporated herein by reference. Other types of pass links may be suitable as well, however.

Figure 3:
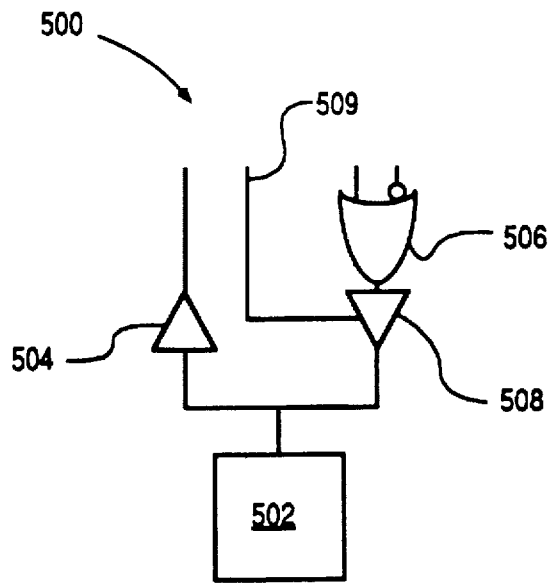
FIG. 3 is a schematic diagram of an input/output cell useful in the field programmable gate array of FIG. 1.

An illustrative IO cell 500 is shown in FIG. 3. The IO cell 500 is suitable for input only or output only, or for bidirectional signaling with a tristate enable control. IO cell 500 includes input/output pin 502. The input circuit comprises pin 502 connected to the input of a driver 504. The output of driver 504 is supplied to a vertical wire or a horizontal wire, as desired. The output circuit comprises OR gate 506 having one true input and one complement input. Output polarity is determined by whether the true or complement input to the OR gate 506 is used. The output of OR gate 506 is supplied to a tristate driver 508, the control terminal 509 of which is connected to a vertical or horizontal wire, as desired. The output of the tristate driver 508 is connected to pin 502.

Figure 4:
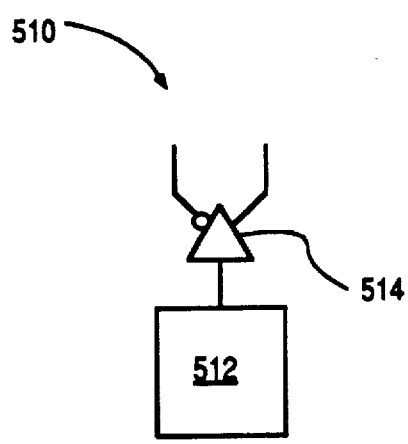
FIG. 4 is a schematic diagram of an input cell useful in the field programmable gate array of FIG. 1.

An illustrative input or I cell 510 is shown in FIG. 4. I cell 510 includes an input pin 512 connected to a double driver buffer 514. Driver 514 is suitable for use in driving high fanout networks such as a clock distribution network, set networks, and reset networks. The driver 514 has a true output and a complement output, which are supplied to respective vertical or horizontal wires, as desired.

VCC pins 34 and 35 are connected to a power distribution bus which extends around the periphery of the field programmable gate array of FIG. 1 and which includes vertical power buses associated with respective columns of logic cells such as a first column comprising logic cells 2 and 6, and a second column comprising logic cells 4 and 8. Similarly, GND pins 36 and 37 are connected to a ground distribution bus which extends around the periphery of the field programmable gate array of FIG. 1 and which includes vertical ground buses associated with respective columns of logic cells such as a first column comprising logic cells 2 and 6, and a second column comprising logic cells 4 and 8.

Figure 5:
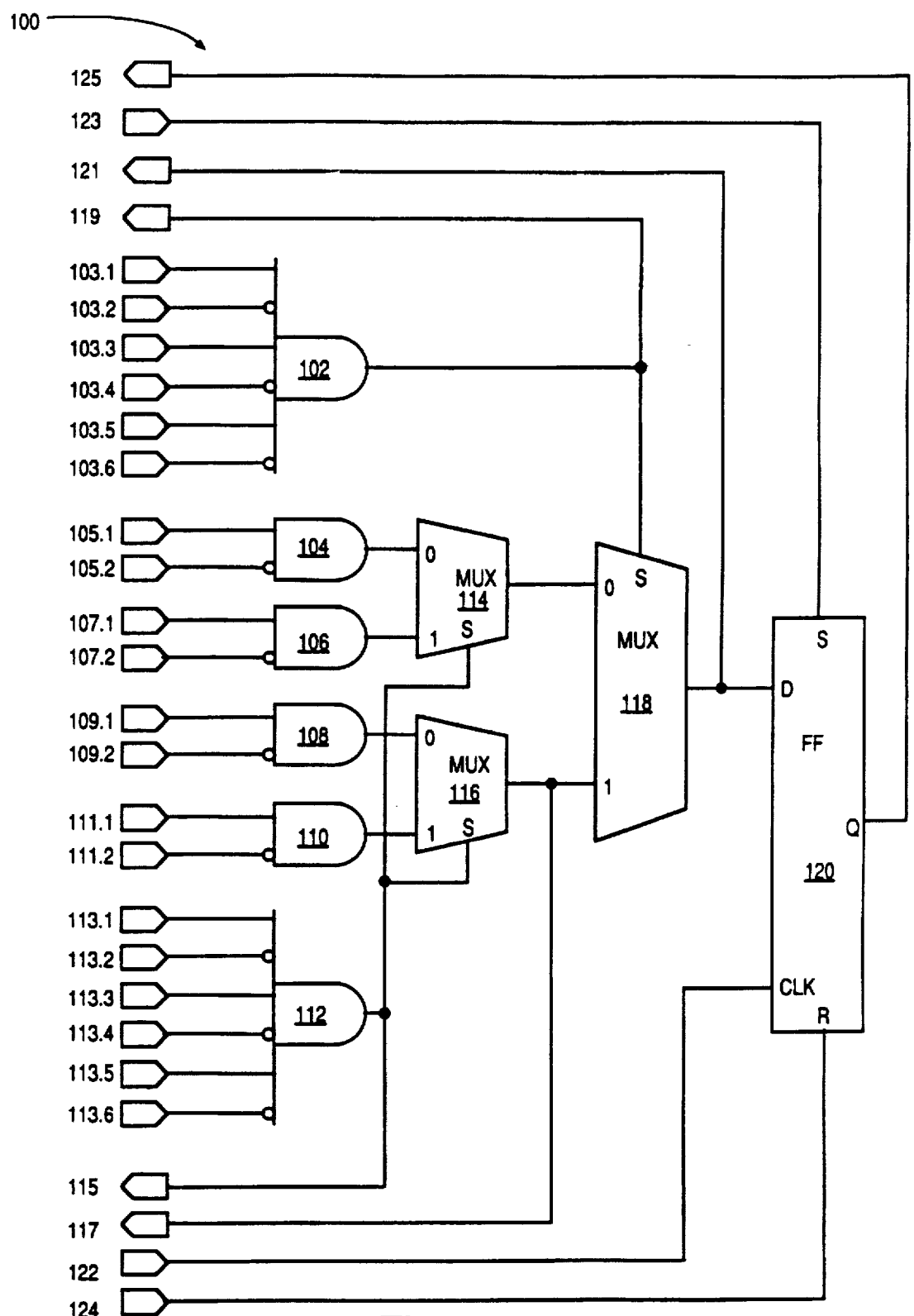
FIG. 5 is a schematic block diagram of a logic cell useful in the field programmable gate array of FIG. 1.

An illustrative logic cell 100 is shown in FIG. 5. Logic cell 100 includes four two input AND gates 104, 106, 108 and 110, each of which has one true input and one complement input. Gate 104 receives a true input 105.1 and a complement input 105.2, and furnishes its output to a data input of 2:1 multiplexer 114. AND gate 106 receives a true input 107.1 and a complement input 107.2, and furnishes its output to the other data input of 2:1 multiplexer 114. Similarly, AND gate 108 receives a true input 109.1 and a complement input 109.2, and furnishes its output to a data input of 2:1 multiplexer 116. AND gate 110 receives a true input 111.1 and a complement input 111.2, and furnishes its output to the other data input of 2:1 multiplexer 116.

The select terminals of both multiplexer 114 and multiplexer 116 are driven by the output of six input AND gate 112, which receives true inputs on lines 113.1, 113.3 and 113.5, and complement inputs on lines 113.2, 113.4 and 113.6. The output of AND gate 112 is also furnished as an output 115 of the logic cell 100.

The output of multiplexer 114 is furnished to one data input of the 2:1 multiplexer 118, and the output of multiplexer 116 is furnished to the other data input of 2:1 multiplexer 118. The output of multiplexer 116 is also furnished as an output 117 of the logic cell 100. The select terminal of multiplexer 118 is driven by the output of AND gate 102, which receives true inputs on lines 103.1, 103.3 and 103.5, and complement inputs on lines 103.2, 103.4 and 103.6. The output of AND gate 102 is also furnished as an output 119 of the logic cell 100.

The output 121 of multiplexer 118 is furnished to the input of a delay or "D" flipflop 120, the output of which is furnished as an output 125 of the logic cell 100. Inputs to the D flipflop 120 include set terminal S and reset terminal R, which are accessible from input lines 123 and 124 respectively, and clock terminal CLK, which is accessible from input line 122.

Other outputs of the logic cell 100 include the output 119 of AND gate 102, the output 115 of AND gate 112, the output 117 of multiplexer 116, and the output 121 of multiplexer 118.

Logic cell 100 is a powerful general purpose universal logic building block suitable for implementing most TTL and gate array macrolibrary functions. The complexity of logic cell 100 is moderate, varying form ten equivalent 2-input NAND gates to twenty-five equivalent 2-input NAND gates depending on user programming. Combinational logic functions as wide as thirteen inputs are realizable with one cell delay. All boolean transfer functions are realizable for up to three inputs. Sequential flipflop functions such as T, JK and count with carry-in are realized with the use of the high performance D flipflop 120, which is initializable with the asynchronous set and reset inputs.

Figure 6:
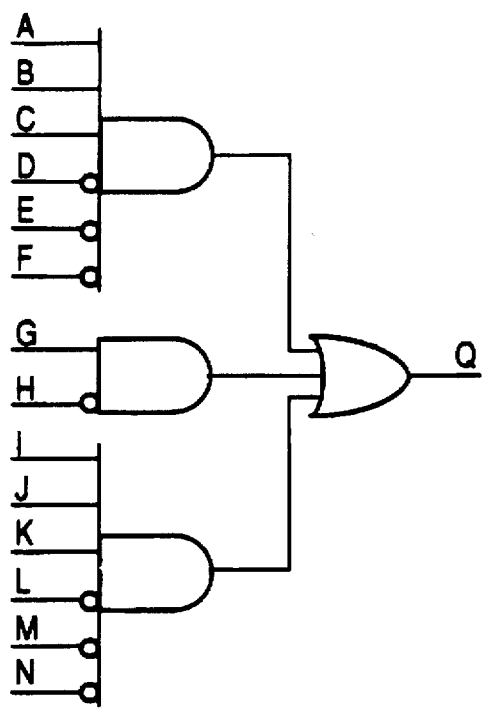
FIG. 6 is a gate level schematic diagram of a macrocell realizable with the logic cell of FIG. 5.

Many of the functions realizable with the logic cell 100 are listed in Table 1. Various realizable AND gates, NAND gates, OR gates, NOR gates, XOR gates, XNOR gates, and MAJ ("majority") gates are listed in Table 1, in which the designation "XiY" following the gate name means a gate of the designated type with X inputs, Y of which are complement and X-Y of which are true. Various realizable buffers and inverters are listed in Table 1, in which BUFF means a buffer, the designation "INVa" means an inverter with its output inverted, and the designation "INVb" means an inverter with its input inverted. The designation SOP14i7 ("sum of products") means the gate shown in FIG. 6. Various realizable multiplexers are listed in Table 1, in which "MUX XxY" means a multiplexer having X inputs with the inputs at positions corresponding to a 1 in the binary equivalent of Y being complemented and the other inputs being true; and in which "MUX XDxY" means dual multiplexers, each having X inputs with the inputs at positions corresponding to a 1 in the binary equivalent of Y being complemented and the other inputs being true. Various realizable decoder gates are listed in Table 1, in which DEC2t4 means a two to four decoder. Various realizable adder gates are listed in Table 1, in which HADDA means a half adder with inputs A and B and outputs sum and carry; FADD1 means a full adder with inputs A, B and carry and outputs sum and carry; CLAADD3 means a three bit carry look ahead adder, and CLAGEN3 means a three bit carry look ahead generator with enable. Various realizable latches are listed in Table 1, in which DLA means a D latch, DLAC means a D latch with clear, DLAMUX means a D latch with 2:1 multiplexer, DLAD means a dual D latch, DLAE means a D latch with enable, DLAEC means a D latch with enable and clear, DLAEMUX means a D latch with enable and a 2:1 multiplexer, DLADE means a dual D latch with enable, DLAiE means a D latch with inverted enable, DLAiEC means a D latch with inverted enable and clear, DLAiEMUX means a D latch with inverted enable and a 2:1 multiplexer, and DLADiE means a dual D latch with inverted enable. Various realizable flipflops are listed in Table 1, in which DFF means a delay flipflop, TFF means a toggle flipflop, and JKFF means a JK flipflop, while the suffix E means "with enable," the suffix iE means "with inverted enable," the suffix P means "with preset," and the suffix C means "with clear." The counter COUNT1 realizable listed in Table 1 is a simple counter having a count-in input, Q and count-out outputs, and preset, clear, and clock inputs.

TABLE 1

| | | | |
|---|---|---|---|
| and14i7 | dlaie | nand4i1 | or4i1 |
| and2i0 | dlaiec | nand4i2 | or4i2 |
| and2i1 | dlaiemux | nand4i3 | or4i3 |
| and2i2 | dlamux | nand4i4 | or4i4 |
| and3i0 | dnctl6 | nand5i0 | or5i0 |
| and3i1 | dnct4 | nand5i1 | or5i1 |
| and3i2 | fadd1 | nand5i2 | or5i2 |
| and3i3 | hadd1 | nand5i3 | or5i3 |
| and4i0 | inipad | nand5i4 | or5i4 |
| and4i1 | inipad | nand5i5 | or5i5 |
| and4i2 | inpad | nand6i0 | or6i0 |
| and4i3 | inva | nand6i1 | or6i1 |
| and4i4 | invb | nand6i2 | or6i2 |
| and5i0 | jkff | nand6i3 | or6i3 |
| and5i1 | jkffpc | nand6i4 | or6i4 |
| and5i2 | maj3i0 | nand6i5 | or6i5 |
| and5i3 | maj3i1 | nand6i6 | or6i6 |
| and5i4 | maj3i2 | nor12i6 | outipad |
| and5i5 | maj3i3 | nor2i0 | outpad |
| and6i0 | mux2dx0 | nor2i1 | sop14i7 |
| and6i1 | mux2dx1 | nor2i2 | shift4 |
| and6i2 | mux2dx2 | nor3i0 | tff |
| and6i3 | mux2dx3 | nor3i1 | tffe |
| and6i4 | mux2x0 | nor3i2 | tffepc |
| and6i5 | mux2x1 | nor3i3 | tffie |
| and6i6 | mux2x2 | nor4i0 | tffiepc |
| biipad | mux2x3 | nor4i1 | tffpc |
| bipad | mux4x0 | nor4i2 | triipad |
| bishift4 | mux4x1 | nor4i3 | tripad |
| buff | mux4x2 | nor4i4 | upctl6 |
| claadd3 | mux4x3 | nor5i0 | upct4 |
| claadd9 | mux4x4 | nor5i1 | updnctl2 |
| clagen3 | mux4x5 | nor5i2 | updnct3a |
| count1 | mux4x6 | nor5i3 | xnor2i0 |
| dec2t4 | mux4x7 | nor5i4 | xnor2i1 |
| dece2t4 | mux4x8 | nor5i5 | xnor2i2 |
| decie2t4 | mux4x9 | nor6i0 | xnor3i0 |
| dff | mux4xa | nor6i1 | xnor3i1 |
| dffc | mux4xb | nor6i2 | xnor3i2 |
| dffe | mux4xc | nor6i3 | xnor3i3 |
| dffepc | mux4xd | nor6i4 | xor2i0 |
| dffie | mux4xe | nor6i5 | xor2i1 |
| dffiepc | mux4xf | nor6i6 | xor2i2 |
| dffpc | nand13i6 | or12i6 | xor3i0 |
| dla | nand2i0 | or2i0 | xor3i1 |
| dlac | nand2i1 | or2i1 | xor3i2 |
| dlad | nand2i2 | or2i2 | xor3i3 |
| dlade | nand3i0 | or3i0 | |
| dladie | nand3i1 | or3i1 | |
| dlae | nand3i2 | or3i2 | |
| dlaec | nand3i3 | or3i3 | |
| dlaemux | nand4i0 | or4i0 | |

Figure 7:
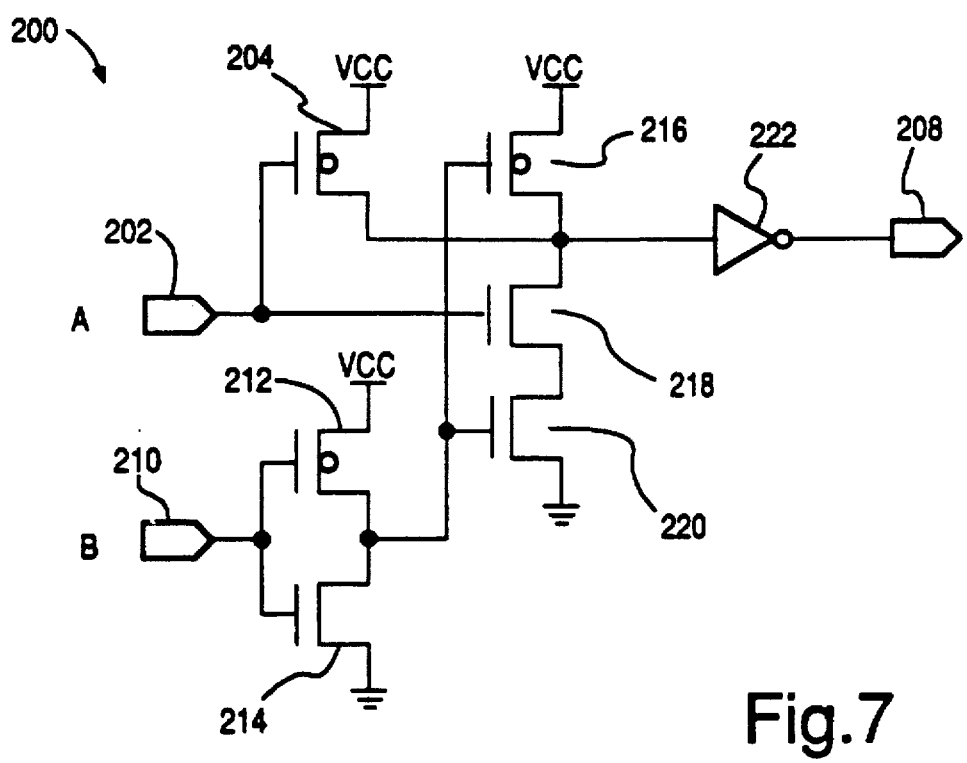
FIG. 7 is a schematic circuit level diagram of a two input AND gate useful in the logic cell of FIG. 5.

The logic blocks of the logic cell 100 may be implemented in a number of suitable ways. One suitable implementation of the two input AND gates 104, 106, 108 and 110 (FIG. 5) is shown in the gate 200 in FIG. 7. Input 202 corresponds to the operand A, and controls the gate of p-channel MOSFET 204. When A=0, transistor 204 is ON, thereby presenting a logical ONE to the input of inverter 222 and resulting in a logical ZERO at the output 208. When A=1 transistor 204 is OFF and n-channel transistor 218 is ON, so that the output 208 is controlled by the state of input 210 which corresponds to the operand B. When B=0, p-channel MOSFET 212 turns ON and n-channel MOSFET 214 turns OFF. The drains of transistors 212 and 214 are connected to a common circuit node, to which the gates of p-channel MOSFET 216 and n-channel MOSFET 220 are connected. Accordingly, transistor 216 is OFF and transistor 220 is ON. As transistor 218 is ON due to A=1, the input of inverter 222 is brought to about ground potential or logical ZERO through transistors 218 and 220, which results in a logical ONE at output 208. When B=1, p-channel MOSFET 212 turns OFF and n-channel MOSFET 214 turns ON. Accordingly, transistor 216 is turned ON and transistor 220 is turned OFF, thereby presenting a logical ONE at the input of inverter 222 and resulting in a logical ZERO at output 208.

Figure 8:
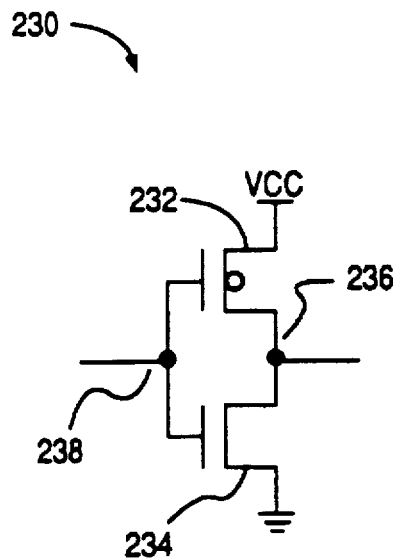
FIG. 8 is a schematic circuit level diagram of an inverter useful in the logic cell of FIG. 5.

The inverter 222 may be implemented in any suitable manner, an example of which is shown in FIG. 8. The inverter 230 of FIG. 8 includes a p-channel MOSFET 232 with its source connected to VCC, and a n-channel MOSFET 234 with its source connected to GND. The drains of transistors 232 and 234 are connected to a common output node 236, and the gates of transistors 232 and 234 are connected to a common input node 238. Transistor 232 conducts when input node 238 is LOW, driving the output node 236 HIGH. Transistor 234 conducts when input node 238 is HIGH, driving the output node 236 LOW.

Figure 9:
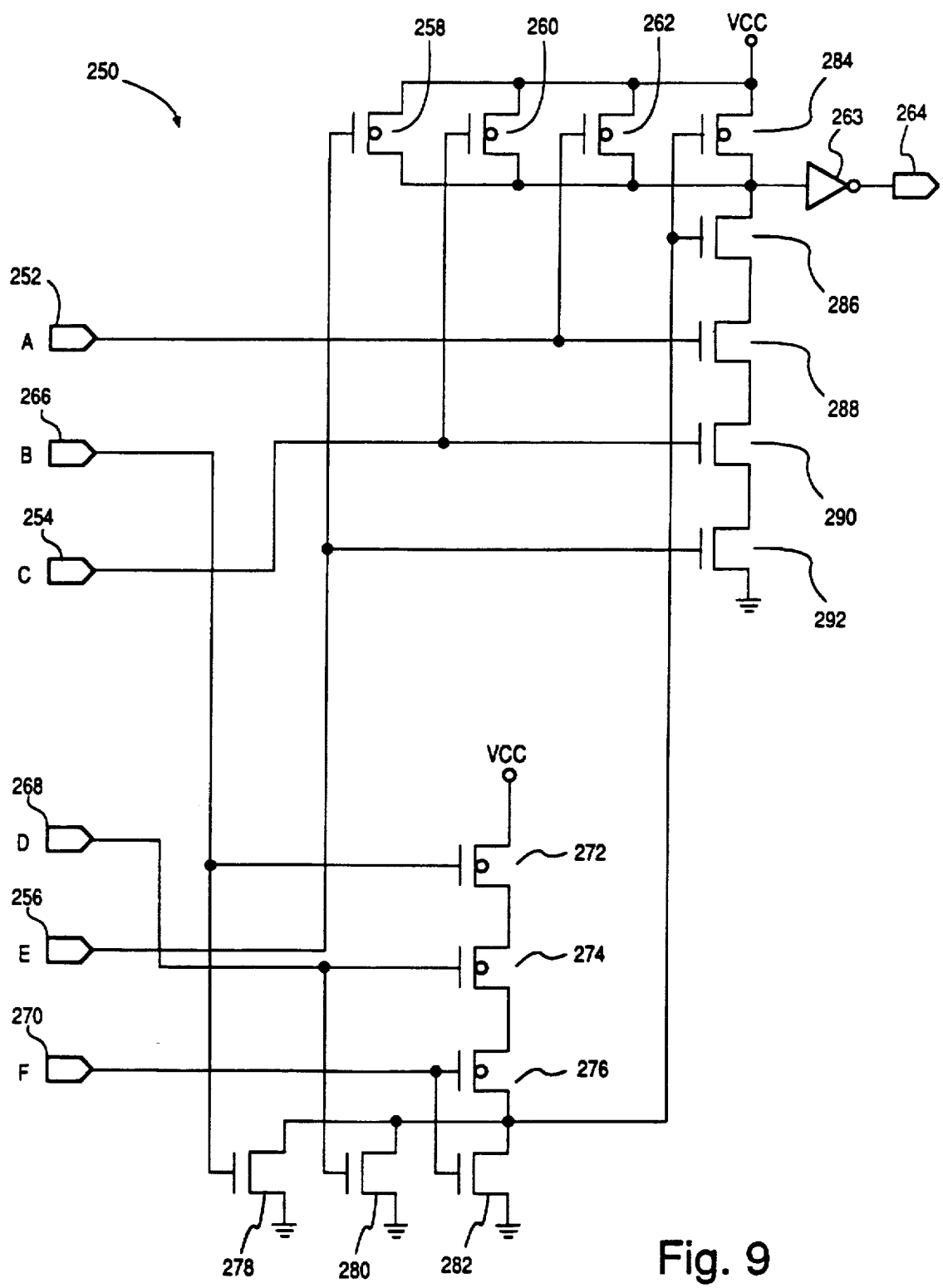
FIG. 9 is a schematic circuit level diagram of a six input AND gate useful in the logic cell of FIG. 5.

One suitable implementation of the six input AND gates 102 and 112 (FIG. 5) is shown in the gate 250 of FIG. 9. Note the following general functional correspondence of components of circuit 250 with components of circuit 200: input terminals 252, 254 and 256 with terminal 202; transistors 258, 260 and 262 with transistor 204A; output terminal 264 with terminal 208; input terminals 266, 268 and 270 with terminal 210; transistors 272, 274 and 276 with transistor 212; transistors 278, 280 and 282 with transistor 214; transistor 284 with transistor 216; transistor 286 with transistor 220; transistors 288, 290 and 292 with transistor 218 and inverter 263 with inverter 222. As the operation of circuit 250 is apparent from the previous description of the operation of circuit 200, no further description of the operation of circuit 250 is recited.

Figure 10:
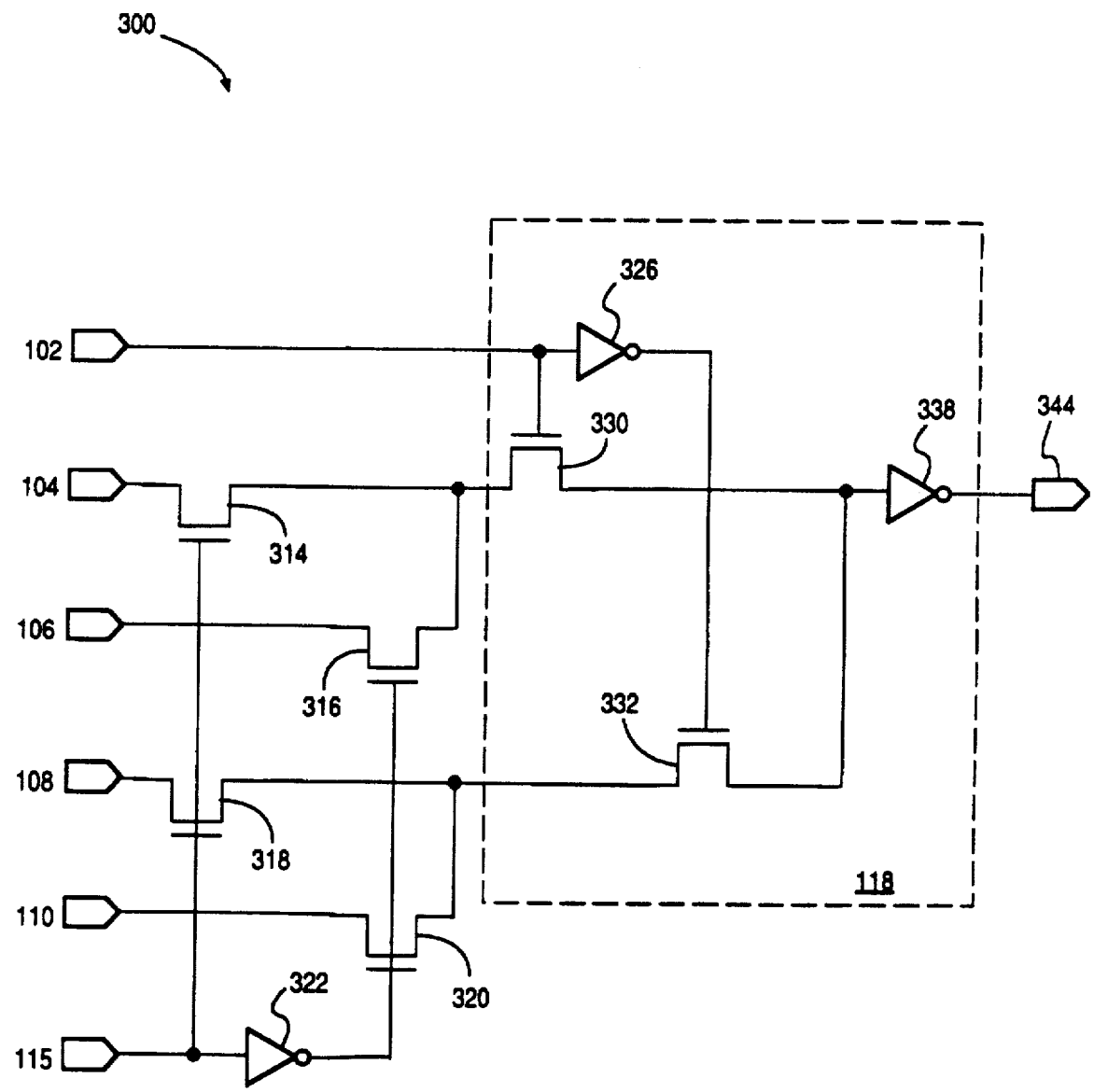
FIG. 10 is a schematic gate level diagram of a multiplexer group useful in the logic cell of FIG. 5.

One suitable implementation of the multiplexers 114, 116 and 118 (FIG. 5) is shown as circuit 300 of FIG. 10. Multiplexer 114 (FIG. 5) includes n-channel MOSFET 314, the gate of which is connected to input 115; and n-channel MOSFET 316, the gate of which is connected to the output of inverter 322 and thereby controlled by the complement of the signal on input 115. Accordingly, only one of pass transistors 314 and 316 is selected at any given time in accordance with the logical state of the signal on input 115. Multiplexer 116 (FIG. 5) includes n-channel MOSFET 318, the gate of which is connected to input 115; and n-channel MOSFET 320, the gate of which is connected to the output of inverter 322 and thereby controlled by the complement of signal on input 115. Accordingly, only one of pass transistors 318 and 320 is selected at any given time in accordance with the logical state of the signal on input 115.

Multiplexer 118 includes n-channel MOSFET 330, the gate of which is connected to input 102; and n-channel MOSFET 332, the gate of which is connected to the output of inverter 326 and thereby controlled by the complement of the signal on input 102. Accordingly, either pass transistor 330, which receives the output of multiplexer 114 from transistor 314 or 316, or pass transistor 332, which receives the output of multiplexer 116 from transistor 318 or 320, is selected at any given time in accordance with the logical state of the signal on input 102. The logical level passed by the selected one of the pass transistors 330 and 332 is furnished to an inverter 338, and supplied on output terminal 344. Inverter 338 is any suitable inverter, such as the inverter 230 of FIG. 8.

Figure 11:
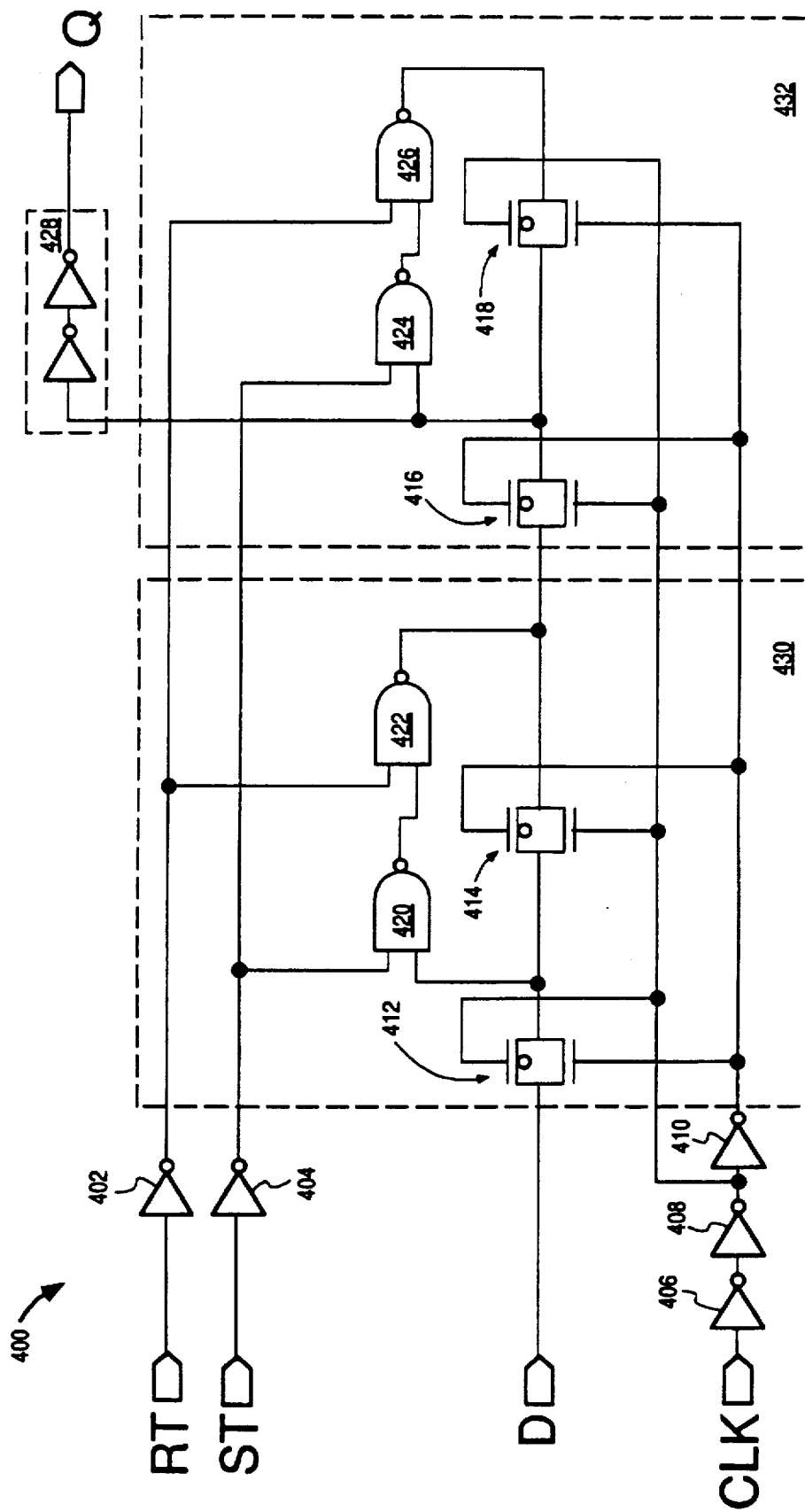
FIG. 11 is a schematic block level diagram of a register or delay flipflop useful in the logic cell of FIG. 5.

One suitable implementation of the flipflop 120 (FIG. 5) is shown as circuit 400 in FIG. 11. The master stage 430 of flipflip 400 comprises NAND gates 420 and 422 and transmission gates 412 and 414. The slave stage 432 of flipflop 400 comprises NAND gates 424 and 426 and transmission gates 416 and 418. Note that a typical transmission gate comprises a p-channel MOSFET and an n-channel MOSFET having their respective sources and drains connected to each other, and their respective gates controlled by the control signal and its complement. In FIG. 11, the control signal for the transmission gates 412, 414, 416 and 418 is signal CLK buffered by inverters 406 and 408, with the complement CLK\ being obtained from inverter 410. The flipflop 400 is reset when signal RT is HIGH (signal ST remains LOW), since the outputs of both NAND gates 422 and 426 are driven HIGH and furnished to output Q through buffer 428 through either transmission gate 416 or gate 418 depending on the state of signal CLK. Buffer 428 comprises two series-connected inverters. The flipflop 400 is set when signal ST is HIGH (signal RT remains LOW), since the outputs of both NAND gates 420 and 424 are driven HIGH, whereby the outputs of both NAND gates 422 and 426 are driven LOW and furnished to output Q through buffer 428 through either transmission gate 416 or gate 418 depending on the state of signal CLK.

When the direct input signals on inputs RT and ST are both LOW, the output of flipflop 120 is determined by the logical state of the clocked input D. Consider first the operation of the circuit 400 when the clock signal CLK is LOW, during which event the state of the flipflop 400 is latched in the slave stage 432 while the master stage 430 responds to the new state presented on input D. Transmission gate 412 is closed so that the master stage 430 is responsive to input D. Specifically, gate 412 passes the signal D to an input of NAND gate 420 (the other input being HIGH due to the inversion of signal ST by inverter 404). The output of NAND gate 420 is furnished to an input of NAND gate 422 (the other input being HIGH due to the inversion of signal RT by inverter 402), which causes D to appear at the output of NAND gate 422. Accordingly, the master stage 430 is driven into a particular state depending on the logical state of D. The output of NAND gate 422 and hence the master section 430 is isolated, however, because transmission gates 414 and 416 are open. Transmission gate 418 of the slave stage 432 passes the state of the output of NAND gate 426 to an input of NAND gate 424 (the other input being HIGH due to the inversion of signal ST by inverter 404), the output of which is furnished to an input of the NAND gate 426 (the other input being HIGH due to the inversion of signal RT by inverter 402). Accordingly, the state of the slave stage 432 is latched, and furnished as output Q through buffer 428. The state of the slave stage 432 is the previous state of the master stage 430.

Consider the operation of the circuit 400 when the clock signal CLK is HIGH, during which event the master stage 430 latches the prior state of input D and furnishes the state to output Q and the slave stage 432. Transmission gates 412 and 418 are open and transmission gates 414 and 416 are closed. Because gate 412 is open, input D is isolated.

Transmission gate 414 of the master stage 430 passes the state of the output of NAND gate 422 to an input of NAND gate 420 (the other input being HIGH due to the inversion of signal ST by inverter 404), the output of which is furnished to an input of the NAND gate 422 (the other input being HIGH due to the inversion of signal RT by inverter 402). Accordingly, the state of the master stage 432 is latched. The latched state of the master stage 432 is furnished as output Q through transmission gate 416 and buffer 428, and also applied to an input of NAND gate 424 (the other input being HIGH due to the inversion of signal ST by inverter 404) through transmission gate 416. The output of NAND gate 424 is applied to an input of NAND gate 426, which drives the slave stage 432 into a particular state depending on the output of the master stage. The output of NAND gate 426 and hence the slave section 432 is isolated, however, because transmission gate 418 is open.

Figure 12:
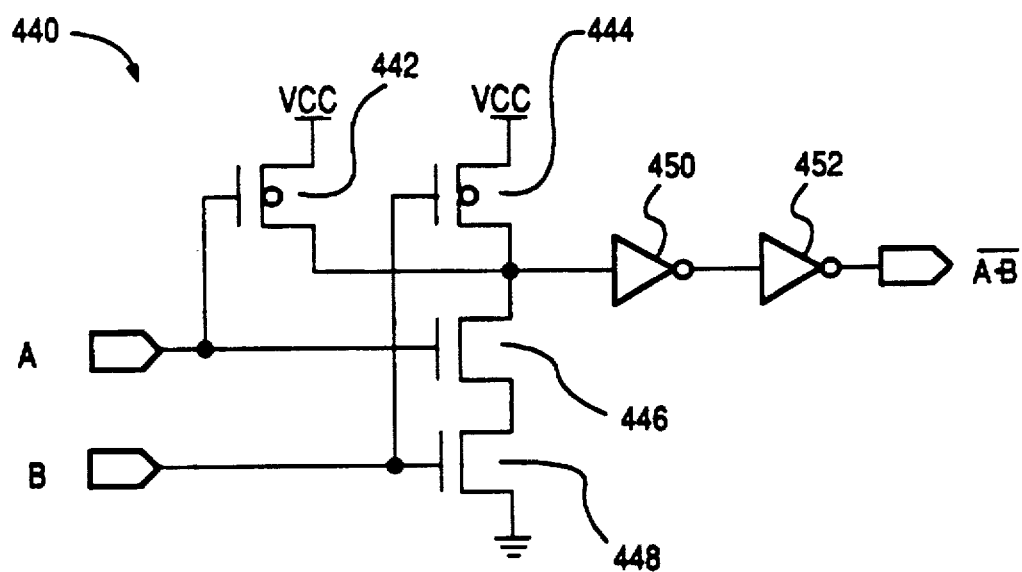
FIG. 12 is a schematic circuit level diagram of a NAND gate useful in the register of FIG. 11.

Note that the various gates of FIG. 11 may be implemented in any suitable manner. A suitable implementation of the inverter gates is the circuit of FIG. 8. A suitable implementation of the NAND gates is the circuit 440 of FIG. 12, in which the input to inverter 450 is raised to VCC through either p-channel MOSFET 442 or p-channel MOSFET 444 when either input A or input B respectively is LOW, and is lowered to GND through n-channel MOSFETs 446 and 448 only when both inputs A and B are HIGH. Inverters 450 and 452 are provided for purposes of driving the following device, and may be omitted if such drive is not required.

A variety of techniques may be used to program the pass links and cross links of the field programmable gate array 100. For example, in one suitable technique, programming transistors are provided in conjunction with each pass link, in conjunction with adjacent horizontal logic cell input wire segments (generally without pass links), and at edges of cell array, operatively connected to the horizontal and vertical wires. A programming voltage of, for example, 12 volts and a ground potential are selectively applied to horizontal and vertical wires in order to close certain antifuses, while a voltage of one-half the programming voltage is applied to other selected wires to prevent closing of other antifuses. The programming transistors are selectively driven ON in order to direct the programming voltages through the network of wires. Once the desired antifuses are closed, the programming transistors are no longer used.

A variety of suitable technologies are available for fabricating the field programmable gate array 100. One suitable process is a one micron, two layer metal CMOS process. In using such a process for the fabrication of field programmable gate array circuit 100, the configuration wires such as horizontal input wire groups 103, 105, 107, 109, 111 and 113, horizontal input wires 122, 123 and 124, and horizontal output wires 115, 117, 119, 121 and 125 preferably are fabricated in first metal; the vertical routing wires such as wire groups 40, 45, 46, 47, 50 and 55 (FIG. 2) are fabricated generally in second metal; and horizontal routing wires such as wire groups 60, 67, 70 and 77 (FIG. 2) are fabricated generally in first metal. Note that pass links such as the pass links indicated at 90, 92, 94 and 96 (FIG. 2) generally are fabricated using a combination of first and second metal, as more fully disclosed in the above-referenced application of Whitten et al., which is incorporated herein by reference.

While our invention has been described with respect to certain embodiments, the scope of the present invention is defined by the appended claims and is not necessarily limited to the embodiments described herein, which are merely illustrative. For example, the fabrication technology, the programming technique, the number and routing of the wires such as the various vertical wires and the various horizontal wires, and the precise composition of the logic cell are illustrative. Accordingly, other embodiments and variations not described herein may be within the scope of our invention, as defined by the appended claims.

What is claimed is:

1. A field programmable gate array comprising a logic cell, the logic cell comprising:

a first multiplexer having a first data input lead, a second data input lead, a select input lead and an output lead;

a second multiplexer having a first data input lead, a second data input lead, a select input lead and an output lead;

a third multiplexer having a first data input lead, a second data input lead, a select input lead and an output lead, the first data input lead of the third multiplexer being coupled to the output lead of the first multiplexer, the second data input lead of the third multiplexer being coupled to the output lead of the second multiplexer;

a first gate having a plurality of input leads and an output lead, the output lead of the first gate being coupled to the select input lead of the first multiplexer;

a second gate having a plurality of input leads and an output lead, the output lead of the second gate being coupled to the select input lead of the third multiplexer;

a third gate having an output lead, the output lead of the third gate being coupled to the first data input lead of the first multiplexer;

a fourth gate having an output lead, the output lead of the fourth gate being coupled to the second data input lead of the first multiplexer;

a fifth gate having an output lead, the output lead of the fifth gate being coupled to the first data input lead of the second multiplexer;

a sixth gate having an output lead, the output lead of the sixth gate being coupled to the second data input lead of the second multiplexer; and a sequential logic element having a data input lead and a clear input lead, the data input lead of the sequential logic element being coupled to the output lead of the third multiplexer, the clear input lead of the sequential logic element being electrically isolated from all of the input leads of the first gate and from all of the input leads of the second gate.

2. A field programmable gate array comprising a logic cell, the logic cell comprising:

a first field effect transistor having a first electrode, a second electrode and a gate electrode;

a second field effect transistor having a first electrode, a second electrode and a gate electrode, the second electrode of the second field effect transistor being coupled to the second electrode of the first field effect transistor;

a third field effect transistor having a first electrode, a second electrode and a gate electrode;

a fourth field effect transistor having a first electrode, a second electrode and a gate electrode, the second electrode of the fourth field effect transistor being coupled to the second electrode of the third field effect transistor;

a first inverter having an input lead and an output lead, the output lead of the inverter being coupled to the gate electrode of the second field effect transistor and being coupled to the gate electrode of the fourth field effect transistor, the input lead of the first inverter being coupled to the gate electrode of the first field effect transistor and being coupled to the gate electrode of the third field effect transistor;

a first gate having a plurality of input leads and an output lead, the output lead of the first gate being coupled to the input lead of the first inverter;

a fifth field effect transistor having a first electrode, a second electrode and a gate electrode, the first electrode of the fifth field effect transistor being coupled to the second electrode of the first field effect transistor;

a sixth field effect transistor having a first electrode, a second electrode and a gate electrode, the first electrode of the sixth field effect transistor being coupled to the second electrode of the third field effect transistor, the second electrode of the sixth field effect transistor being coupled to the second electrode of the fifth field effect transistor;

a second inverter having an input lead and an output lead, the output lead of the second inverter being coupled to the gate electrode of the sixth field effect transistor, the input lead of the second inverter being coupled to the gate electrode of the fifth field effect transistor;

a second gate having a plurality of input leads and an output lead, the output lead of the second gate being coupled to the input lead of the second inverter;

a sequential logic element having a data input lead and a clear input lead, the data input lead being coupled to the second electrode of the fifth field effect transistor, the clear input lead being electrically isolated from all of the input leads of the first gate and from all of the input leads of the second gate;

a third gate having an output lead, the output lead of the third gate being coupled to the first electrode of the first field effect transistor;

a fourth gate having an output lead, the output lead of the fourth gate being coupled to the first electrode of the second field effect transistor;

a fifth gate having an output lead, the output lead of the fifth gate being coupled to the first electrode of the third field effect transistor; and a sixth gate having an output lead, the output lead of the sixth gate being coupled to the first electrode of the fourth field effect transistor.

* * * * *